United States Patent
Mecchia et al.

(10) Patent No.: US 10,648,813 B2
(45) Date of Patent: May 12, 2020

(54) DEMODULATOR FOR IN-PHASE AND QUADRATURE MODULATED SIGNALS, MEMS GYROSCOPE INCLUDING THE SAME AND DEMODULATION METHOD

(71) Applicant: STMicroelectronics S.r.l., Agrate Brianza (IT)

(72) Inventors: Alessandro Mecchia, Vimercate (IT); Matteo Quartiroli, Broni (IT); Paolo Pesenti, Senago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 239 days.

(21) Appl. No.: 15/919,874

(22) Filed: Mar. 13, 2018

(65) Prior Publication Data

US 2018/0274924 A1 Sep. 27, 2018

(30) Foreign Application Priority Data

Mar. 21, 2017 (IT) .................... 102017000031167

(51) Int. Cl.
*G01C 19/5776* (2012.01)
*G01C 19/5712* (2012.01)
(Continued)

(52) U.S. Cl.
CPC .......... *G01C 19/5776* (2013.01); *B81B 7/00* (2013.01); *B81B 7/008* (2013.01);
(Continued)

(58) Field of Classification Search
CPC .......... G01C 19/5712; G01C 19/5776; H04L 27/3863; B81B 7/00; B81B 7/008; B81B 2201/0242

See application file for complete search history.

(56) References Cited

U.S. PATENT DOCUMENTS

| 6,553,833 B1 * | 4/2003 | Funk .................. G01C 19/5712 73/504.08 |
| 7,567,611 B2 * | 7/2009 | Chien ..................... H04B 1/30 375/219 |

(Continued)

FOREIGN PATENT DOCUMENTS

JP 11-142161 A 5/1999

OTHER PUBLICATIONS

"Delta-sigma modulation," Wikipedia, Aug. 11, 2016, retrieved from https://en.wikipedia.org/w/index.php?title=Delta-sigma_modulation&oldid=733924406 on Nov. 12, 2017, 14 pages.

(Continued)

*Primary Examiner* — David J Bolduc
(74) *Attorney, Agent, or Firm* — Seed IP Law Group LLP

(57) ABSTRACT

A demodulator demodulates an in-phase component of an input signal which is in-phase and quadrature modulated. The demodulator includes a register storing a phase calibration value having an integer part and a fractional part. A noise-shaping modulator generates a succession of quantized values of integer type, the quantized values having a mean equal to the phase calibration value. A generating stage generates a demodulating signal phase locked with the input signal, the demodulating signal having a phase which depends linearly on the quantized values. A demodulating stage demodulates the input signal by means of the demodulating signal.

20 Claims, 4 Drawing Sheets

(51) Int. Cl.
    *H04L 27/38*     (2006.01)
    *B81B 7/00*     (2006.01)

(52) U.S. Cl.
    CPC ...... *G01C 19/5712* (2013.01); *H04L 27/3863* (2013.01); *B81B 2201/0242* (2013.01)

(56) References Cited

U.S. PATENT DOCUMENTS

| | | | | |
|---|---|---|---|---|
| 7,680,196 | B2* | 3/2010 | Azuma | H04B 17/12 375/219 |
| 8,364,401 | B2* | 1/2013 | Da Silva | G01S 19/47 701/400 |
| 8,687,684 | B1* | 4/2014 | Huynh | H03M 3/382 375/224 |
| 9,575,089 | B1 | 2/2017 | Cazzaniga et al. | |
| 9,625,272 | B2* | 4/2017 | Tao | G01C 19/5776 |
| 2003/0206603 | A1* | 11/2003 | Husted | H04L 27/3863 375/324 |
| 2005/0227642 | A1* | 10/2005 | Jensen | H04L 27/0014 455/127.1 |
| 2006/0079195 | A1* | 4/2006 | Beamish | H04B 1/30 455/313 |
| 2007/0099570 | A1* | 5/2007 | Gao | H04B 1/30 455/63.1 |
| 2008/0025381 | A1* | 1/2008 | Lee | H04B 1/30 375/219 |
| 2008/0205536 | A1* | 8/2008 | Lee | H04L 27/3845 375/261 |
| 2010/0027689 | A1* | 2/2010 | Kohlmann | H04L 27/368 375/260 |
| 2010/0142648 | A1* | 6/2010 | Yu | H04L 27/3863 375/316 |
| 2011/0013724 | A1* | 1/2011 | Metreaud | H04L 27/0014 375/296 |
| 2011/0026643 | A1* | 2/2011 | Ruelke | H03G 3/3068 375/319 |
| 2011/0128992 | A1* | 6/2011 | Maeda | H04B 17/0085 375/130 |
| 2012/0263262 | A1* | 10/2012 | Etemadi | H04L 27/3863 375/345 |
| 2013/0031950 | A1* | 2/2013 | Donadel | G01C 19/5776 73/1.77 |
| 2013/0223571 | A1* | 8/2013 | Dark | H04B 1/0028 375/340 |
| 2014/0056337 | A1* | 2/2014 | Kesling | H04B 1/38 375/219 |
| 2014/0190258 | A1* | 7/2014 | Donadel | G01C 19/5776 73/504.12 |
| 2014/0300425 | A1* | 10/2014 | Cazzaniga | G01C 19/5776 331/154 |
| 2015/0057959 | A1 | 2/2015 | Ezekwe | |
| 2015/0192415 | A1 | 7/2015 | Ge et al. | |
| 2015/0236739 | A1* | 8/2015 | Montalvo | H03M 1/0626 455/307 |
| 2016/0091339 | A1* | 3/2016 | Weinberg | G01C 25/00 73/1.77 |
| 2016/0161256 | A1* | 6/2016 | Lee | B81B 7/008 73/504.12 |
| 2017/0070299 | A1* | 3/2017 | Hagiwara | H04B 17/21 |
| 2017/0102248 | A1* | 4/2017 | Maurer | G01C 19/5726 |
| 2017/0184400 | A1* | 6/2017 | Valzasina | G01C 19/574 |
| 2017/0328712 | A1* | 11/2017 | Collin | G01C 19/5726 |
| 2018/0209816 | A1* | 7/2018 | Hodjat-Shamami | G01C 25/005 |
| 2019/0145773 | A1* | 5/2019 | Collin | G01C 19/5776 73/504.12 |

OTHER PUBLICATIONS

"Noise shaping," Wikipedia, Jan. 19, 2017, retrieved from https://en.wikipedia.org/w/index.php?title=Noise_shaping&oldid=760867075 on Nov. 12, 2017, 4 pages.

* cited by examiner

DEMODULATOR FOR IN-PHASE AND QUADRATURE MODULATED SIGNALS, MEMS GYROSCOPE INCLUDING THE SAME AND DEMODULATION METHOD

BACKGROUND

Technical Field

This disclosure relates to a demodulator for in-phase and quadrature modulated signals and a MEMS gyroscope including the same. The disclosure also relates to a demodulation method.

Description of the Related Art

As is known, so-called MEMS gyroscopes, which are angular velocity sensors capable of sensing an external stimulus due to the Coriolis force, are now available. The Coriolis force is, in turn, an inertial force acting on a moving mass which moves with respect to a rotating reference frame, the force being proportional to the velocity of the moving mass and the angular velocity of the frame.

By way of example FIG. 1 shows a MEMS gyroscope 1 formed by a first die 2 of semiconductor material (typically silicon), which in turn forms an oscillating system 4. Although not shown in detail, the oscillating system 4 includes one or more moving masses of semiconductor material which oscillate with respect to a frame (not shown) to which they are attached by means of springs (not shown); the frame is also formed by the first die 2. In addition to this, assuming an orthogonal xyz reference system which is of one piece with the frame, when in use the moving masses oscillate along a direction parallel to, for example, the x axis, which is also referred to as the driving direction.

More particularly, the driving electrodes 6 are present in the first die 2; in addition to this, the MEMS gyroscope 1 also comprises a second die 8 within which there is formed a driving circuitry 10 which is electrically connected to the driving electrodes 6, to which it provides one or more driving signals; in what follows it will be assumed for simplicity that only a single driving signal is present. The driving electrodes 6 are in turn capacitively coupled to the moving masses in such a way that electrostatic forces which depend on the driving signal and are such as to keep the moving masses in oscillation parallel to the driving direction are set up between the moving masses and the driving electrodes 6.

Further electrodes 12 are also present on the first die 2, and these will be referred to as the first sensing electrodes 12. The first sensing electrodes 12 are capacitively coupled to the moving masses so as to form variable capacitors with the latter, the capacitance values of which are indicative of the positions of the moving masses along the driving direction. In addition to this, the first sensing electrodes 12 are electrically coupled to the driving circuitry 10 in such a way that the driving circuitry 10 receives a first sense signal indicative of the capacitance of the abovementioned variable capacitors and therefore the positions of the moving masses along the driving direction. The driving circuitry 10 therefore generates a driving signal as a function of the first sense signal.

In greater detail, the driving signal is generated by the driving circuitry 10 in such a way that the moving masses (or the moving mass, if only one moving mass is present; reference will be made below to a situation with more than one moving mass, by way of example) oscillate with the same frequency $f_d$ which to a first approximation is equal to the mechanical resonance frequency of the oscillating system 4 along the driving direction. In practice, one oscillation mode of the oscillating system 4 is excited.

In order to generate the driving signal, the driving circuitry 10 forms a phase-locked loop (PLL, not shown) which receives the first sense signal as an input; both the first sense signal and the driving signal have frequencies equal to the frequency $f_d$ and are locked in phase.

Further electrodes 14, which will be referred to below as second sensing electrodes 14, are also present in the first die 2.

The second sensing electrodes 14 are capacitively coupled to the moving masses in such a way as to form corresponding variable capacitors, the capacitances of which are indicative of the positions of the moving masses with respect to (for example) the z axis, that is with respect to a direction known as a sense direction. In this respect, it should be pointed out that the abovementioned springs are such that the moving masses can not only move parallel to the x axis, but also parallel to the z axis. Furthermore, assuming that MEMS gyroscope 1 rotates parallel to the y axis, it will be found that the moving masses are subjected to Coriolis forces which are directed parallel to the z axis. For example, MEMS gyroscopes are common, which include, each, two moving masses driven so as to move in counterphase along the x axis and experience Coriolis forces that are identical in modulus and have opposite directions parallel to the z axis.

In practice, the velocities of the moving masses not only include components parallel to the driving direction, but also components parallel to the sense direction, which are indicative of the angular velocity experienced by the MEMS gyroscope 1 and are modulated in amplitude with a frequency equal to the abovementioned frequency $f_d$.

From another point of view, the oscillating system 4 has a mechanical transfer function $H_1(t)$ relating to the driving and corresponding movements of the moving masses along the driving direction, and a mechanical transfer function $H_2(t)$ which provides a relationship between the movements of the moving masses along the sense direction and the Coriolis force acting on the moving masses.

The MEMS gyroscope 1 also comprises a processing stage 20 which is formed in the second die 8 and is electrically connected to the second sensing electrodes 14. The processing stage 20 has the ability to translate the variable capacitances of the capacitors formed by the second sensing electrodes 14 into a quantity which is proportional to the angular velocity experienced by MEMS gyroscope 1. Together with the driving circuitry 10, the processing stage 20 therefore forms a control and sensing system for the oscillating system 4 of the MEMS gyroscope 1.

In particular, the processing stage 20 comprises an acquisition stage 22 and a demodulation stage 24, both of the analog type. In addition to this, the demodulation stage 24 comprises a multiplier stage 26, a signal generator 28 and a filtering stage 30.

The acquisition stage 22 is electrically coupled to the second sensing electrodes 14 so that, when in use, it receives a second sense signal as an input, which will be referred to below as the input signal $S_{in}$. The input signal $S_{in}$ is indicative of the capacitance of the variable capacitors formed by the second sensing electrodes 14 and the moving masses, and therefore the positions of the moving masses in the sense direction. The input signal $S_{in}$ is therefore indicative of the angular velocity experienced by the MEMS gyroscope 1. In addition to this, the input signal $S_{in}$ has a frequency of $f_d$ if the angular velocity is constant, or is modulated in amplitude at frequency $f_d$.

The acquisition stage 22 generates a signal at its own output which will be referred to below as the acquired signal $S_{acq}$, which is typically a voltage signal. For this purpose, the acquisition stage 22 includes a capacitance-voltage conversion circuit, which makes it possible to generate a voltage signal (in particular, the acquired signal $S_{acq}$) from a capacitance signal (in particular, the input signal $S_{in}$).

The output of the acquisition stage 22 is connected to a first input of the multiplier stage 26, a second input of which is connected to the output of the signal generator 28; the output of the multiplier stage 26 is connected to the input of the filtering stage 30.

The signal generator 28 generates an intermediate signal $S_{int}$ at its own output in such a way that the multiplier stage 26 generates a product signal $S_{prod}$ at its own output, equal to the product of the intermediate signal $S_{int}$ and the acquired signal $S_{acq}$.

The intermediate signal $S_{int}$ has a frequency equal to abovementioned frequency $f_d$ and is phase locked with the acquired signal $S_{acq}$, and therefore also with the driving signal. For this purpose, the signal generator 28 is connected to the PLL (not shown) formed by the driving circuitry 10.

For example, the intermediate signal $S_{int}$ is proportional to $\cos(\omega_d t + \varphi_{trim})$, where $\omega_d = 2\pi f_d$ and $\varphi_{trim}$ indicates a phase shift introduced during a step of calibrating the signal generator 28 in order ideally to obtain $\varphi_{trim} = \Delta\varphi$, where $\Delta\varphi$ indicates the phase shift introduced by the mechanical transfer function $H_2(t)$ and the acquisition stage 22 with respect to the driving signal. Alternatively, the intermediate signal $S_{int}$ may be equal to a square wave of sgn $[\cos(\omega_d t + \varphi_{trim})]$, where "sgn" indicates the sign function; for simplicity of mathematical analysis, it is assumed below that the intermediate signal $S_{int}$ will be proportional to $\cos(\omega_d t + \varphi_{trim})$, although for practical purposes there will not be any difference.

Subsequently, the filtering stage 30, of the low pass type, generates a demodulated signal $S_{dem}$ in the base band, which is in fact indicative of the abovementioned quantity proportional to the angular velocity of MEMS gyroscope 1. Assuming that the MEMS gyroscope 1 experiences a constant angular velocity, the demodulated signal $S_{dem}$ will be constant.

The demodulated signal $S_{dem}$ is then passed to an analog-to-digital converter 32 formed in the second die 8, which generates a digitized version of the demodulated signal $S_{dem}$. In turn, the analog-to-digital converter 32 is connected for example to a digital signal processor (DSP) 34, which may be formed in the second die 8 and is capable of performing further processing, such as for example filtering, gain and sampling frequency reduction operations. In addition to this, the digital signal processor 34 may be coupled to a display device (not shown) which makes it possible to display the abovementioned quantity proportional to the angular velocity of MEMS gyroscope 1.

From a more quantitative point of view, the acquired signal $S_{acq}$ is equal to $C^*\cos(\omega_d t + \Delta\varphi) + Q^*\sin(\omega_d t + \Delta\varphi)$, in which C is proportional to the Coriolis force, while Q represents the so-called quadrature error.

In more detail, Q represents the error caused by undesired mechanical coupling between the driving mode of the oscillating system 4 and the so-called sense mode of the oscillating system 4. For example, C may be approximately equal to a thousand degrees per second (dps), while Q may be of the order of tens of thousands of dps. In addition to this, Q can be assumed to be constant.

In other words, the acquired signal $S_{acq}$ comprises an in-phase component proportional to the Coriolis force and therefore the angular velocity experienced by the MEMS gyroscope 1, and an undesired quadrature component.

In greater detail, because of inevitable inaccuracies in construction, movement of the moving masses is characterized by the presence of components directed in the sense direction, even if no Coriolis force is present. This movement in the sense direction represents a kind of spurious component which overlaps the useful component caused by the Coriolis force.

As is known, the spurious movement is periodic with a frequency of $f_d$ and is in phase with the first sense signal; in addition to this, the spurious movement has a not at all negligible amplitude, given that this may be an order of magnitude greater than the full scale for MEMS gyroscope 1. More particularly, the spurious movement is equivalent to that induced by a hypothetical quadrature force which depends on a coupling coefficient between the sense mode and the drive mode.

This being the case, the product signal $S_{prod}$ is proportional to $[C^*\cos(\omega_d t + \Delta\varphi) + Q^*\sin(\omega_d t + \Delta\varphi)]^*\cos(\omega_d t + \varphi_{trim})$. Also, referring to the phase error $\varphi_{err}$ to indicate the difference $\Delta\varphi - \varphi_{trim}$, and assuming that error $\varphi_{err}$ tends to zero, the product signal $S_{prod}$ will be approximately proportional to $(C - Q^*\varphi_{err}) + (C + Q^*\varphi_{err})^*\cos(2\omega_d t) + (Q - C^*\varphi_{err})^*\sin(2\omega_d t)$, and therefore that, after the higher order harmonics have been filtered out by the filtering stage 30, the demodulated signal $S_{dem}$ will be approximately proportional to $(C - Q^*\varphi_{err})$. Given that Q typically has very high values, it will also be noted that minimum calibration values, that is minimum non-null values for the phase error $\varphi_{err}$, give rise to a projection of the quadrature signal onto the in-phase component, with the consequent occurrence of measurement errors.

In greater detail, within the PLL of the driving circuitry 10 there is generated a clock signal having a frequency of $f_{PLL} = N^*f_d$, with N for example equal to 1024, and this is provided to the signal generator 28. The clock signal is phase locked with the first sense signal and with the driving signal; in particular, the clock signal has a zero phase shift with respect to the first sense signal and has a fixed phase shift with respect to the driving signal.

During the calibration step, the value of $\varphi_{trim}$, and therefore the phase of the intermediate signal $S_{int}$, may be varied by an integer number (possibly one) of clock signal cycles, in order to find the value which minimizes the phase error $\varphi_{err}$. Therefore, the resolution $\varphi_{step}$ of the intermediate signal $S_{int}$ in phase is equal to $2\pi^*f_d/f_{PLL}$, that is $2\pi/N$. After calibration, the maximum phase error $\varphi_{err}$ is therefore equal to $\varphi_{err} = \varphi_{step}/2 = \pi/N$. Assuming for example that $Q = 10^4$ dps, $f_{PLL} = 20$ MHz and $f_d = 20$ kHz, we obtain $Q^*\varphi_{step}/2 = 31$ dps.

In order to reduce the impact of the quadrature component on the demodulated signal $S_{dem}$, and therefore on the final measurement of the angular velocity, it is possible in theory to increase the frequency $f_{PLL}$, but this involves an increase in the area and in the consumption, as well as an increase in the circuit complexity. Other solutions provide for the provision of two demodulators and of two analog-to-digital converters, so as to separately demodulate and digitize the in-phase component and the quadrature component, and subsequently for performing realignment operations in the digital domain; this solution, too, involves an increase in the consumption and in the area, however.

BRIEF SUMMARY

The present disclosure provides a demodulator for a MEMS gyroscope which makes it possible to overcome at least some of the disadvantages in the known art.

According to the present disclosure, a demodulator and a demodulation method are provided.

In one embodiment, a demodulator is configured to demodulate the in-phase component of an input signal modulated in-phase and quadrature. The demodulator includes a register configured to store a phase calibration value having an integer part and a fractional part. A noise-shaping modulator is configured to generate a succession of quantized values of integer type, the quantized values having a mean equal to the phase calibration value. A generation stage is configured to generate a demodulating signal phase locked with the input signal, the demodulating signal having a phase which depends linearly on the quantized values. A demodulation stage is configured to demodulate the input signal through the demodulating signal.

According to another embodiment, a method for demodulating the in-phase component of an input signal which is in-phase and quadrature modulated includes storing a phase calibration value having an integer part and a fractional part and generating, through a noise-shaping modulator, a succession of quantized values of integer type. The quantized values have a mean equal to the phase calibration value. The method further includes generating a demodulating signal phase locked with the input signal, where the demodulating signal has a phase which depends linearly on the quantized values and demodulating the input signal by means of the demodulating signal.

BRIEF DESCRIPTION OF THE SEVERAL VIEWS OF THE DRAWINGS

For a better understanding of the present disclosure preferred embodiments will now be described purely by way of non-limiting example and with reference to the appended drawings, in which.

DETAILED DESCRIPTION

The present demodulator derives from an idea by the Applicant which noted that, if it is not possible in general to identify an exact value of $\varphi_{trim}$ equal to $\Delta\varphi$, because of the limited resolution guaranteed by the frequency $f_{PLL}$, it is however possible to vary the value of $\varphi_{trim}$ over time between a plurality of available values, in such a way that the mean value of $\varphi_{trim}$ better approximates $\Delta\varphi$.

Figure 1:
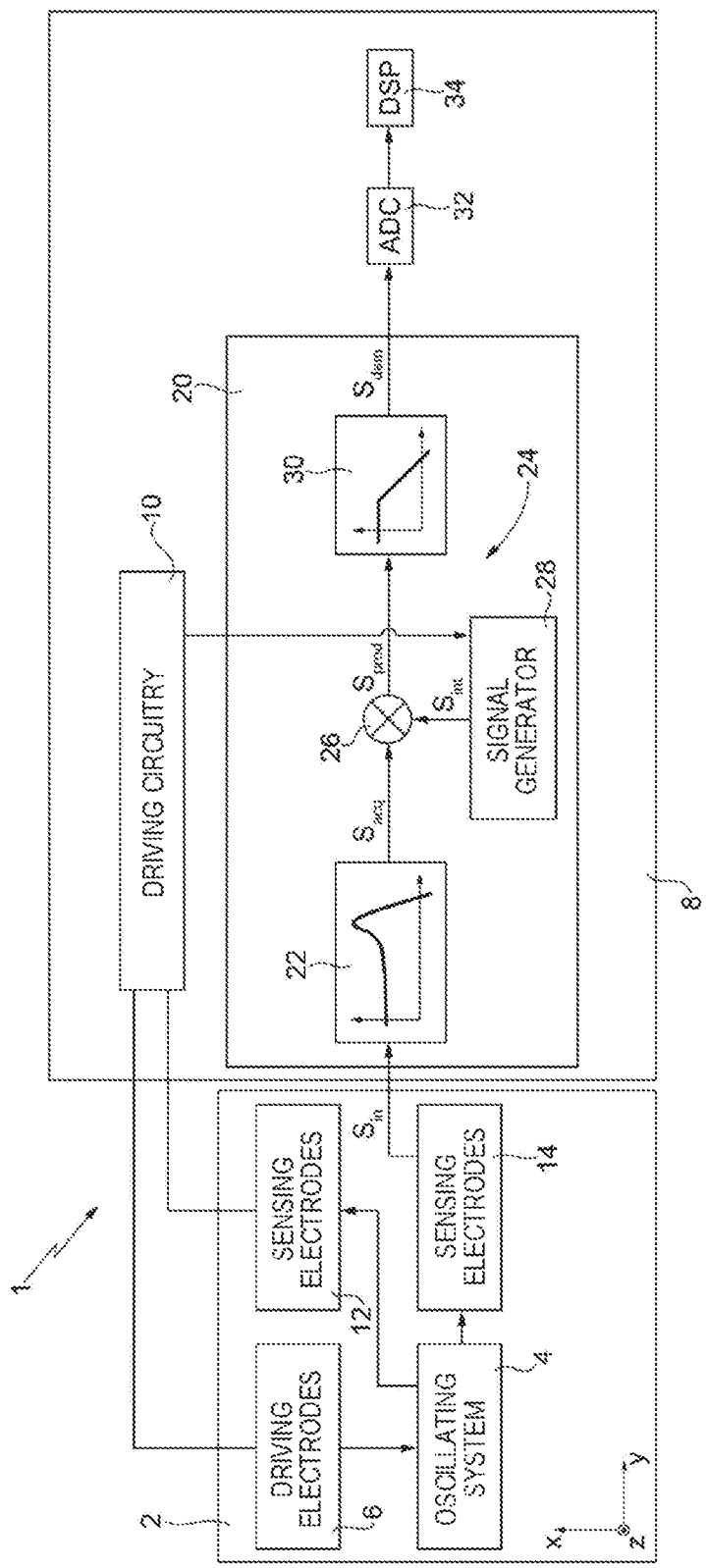
FIG. 1 is a block diagram of a MEMS gyroscope of a known type.

In greater detail, reference is made below to the MEMS gyroscope 50 shown in FIG. 2, in which components already present in the MEMS gyroscope 1 shown in FIG. 1 are indicated using the same reference numbers, except where specified otherwise. Also, the MEMS gyroscope 50 is described below only in relation to the differences with respect to the MEMS gyroscope 1 shown in FIG. 1.

In detail, the signal generator of the MEMS gyroscope 50, indicated by 58, generates a signal S' of the analog type, which will be referred to below as the demodulating signal.

Figure 3:
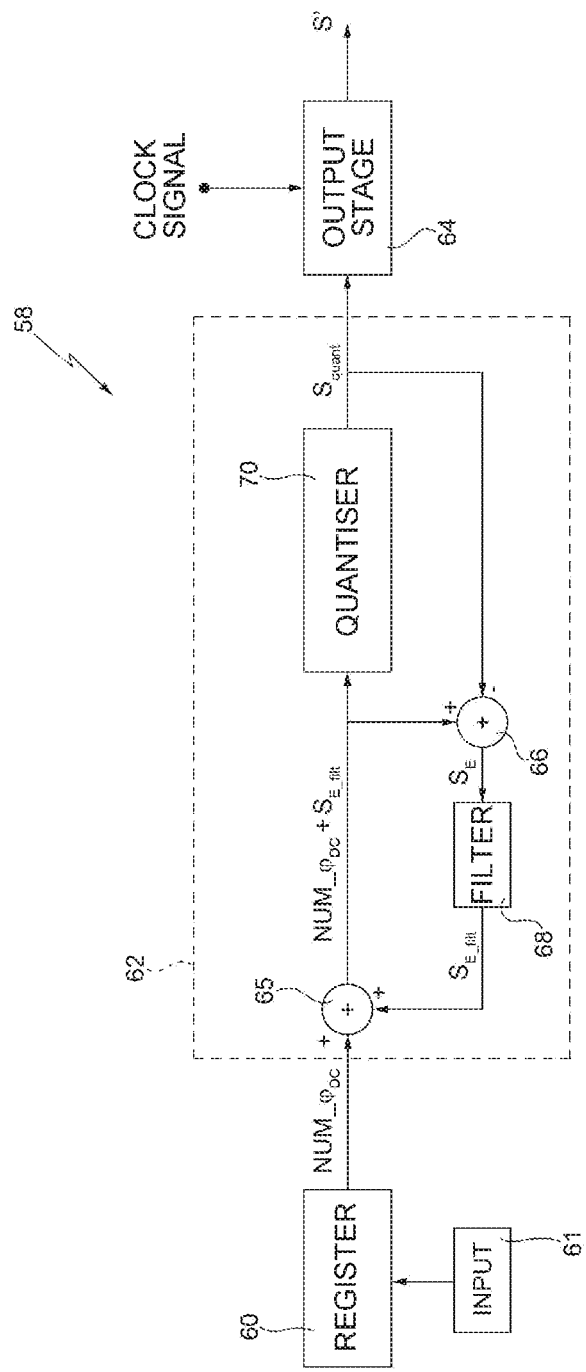
FIG. 3 shows a block diagram of a portion of the MEMS gyroscope illustrated in FIG. 2.

In particular, as illustrated in FIG. 3, the signal generator 58 comprises a register 60, an input device 61, a sigma-delta modulator 62 and an output stage 64.

In detail, the register 60 is capable of storing a certain number of bits (for example sixteen); in particular, a first part of such bits (for example eight) represents an integer part of the value stored in the register 60, while a second part of such bits (for example eight) represents a fractional part. The overall number of bits of the register 60 and the subdivision between the integer part and the fractional part can be selected as a function of the expected amplitude of the phase error and the desired accuracy respectively.

The input device 61 is coupled to the register 60 and can be controlled by a user so as to allow the user to store a desired value in the register 60 from time to time, in particular during calibration. The value stored in the register 60 is referred to below as $NUM\_\varphi_{DC}$; this value is described in greater detail below.

The output of the register 60 is connected to the input of the sigma-delta modulator 62, which is of a type which is in itself known and operates as a so-called noise-shaper. In this respect, without any loss of generality, FIG. 3 shows an embodiment of the sigma-delta modulator 62 comprising an adder 65, a subtraction circuit 66, a digital filter 68, which will be referred to below as the feedback filter 68, and a quantizer 70. The feedback filter 68 performs a function $H_{noise}(z)$ of the high pass type between its input and the output of the quantizer 70, which spectrally shapes the signal present at the input of the feedback filter 68, which will be referred to below as the signal $S_E$. For this purpose, the feedback filter 68 may have a transfer function $H_f(z)=1-H_{noise}(z)$.

In detail, a first input of the adder 65 is connected to the output of the register 60, while a second input is connected to the output of the feedback filter 68; the output from the adder 65 is connected to the input of the quantizer 70, and to a first (positive) input of the subtraction circuit 66, the second (negative) input of which is connected to the output of the quantizer 70. The output from the subtraction circuit 66 is connected to the input of the feedback filter 68.

In use, the adder 65 generates at its own output a signal equal to the sum of the value $NUM\_\varphi_{DC}$ and a signal $S_{E\_filt}$ generated by the feedback filter 68 and described in greater detail below. The subtraction circuit 66 generates the abovementioned signal $S_E$ at its own output, the signal $S_E$ being equal to the difference between the abovementioned signal equal to the sum of the value $NUM\_\varphi_{DC}$ and of the signal $S_{E\_filt}$ and the signal present at the output of the quantizer 70, which will be referred to below as the quantized signal $S_{quant}$. Furthermore, the feedback filter 68 generates the abovementioned signal $S_{E\_filt}$.

In greater detail, the quantizer 70 operates at output on a number of bits equal to the bits of the register 60 which are dedicated to representing the integer part of $NUM\_\varphi_{DC}$. The adder 65, the subtraction circuit 66, the feedback filter 68 and the input of the quantizer 70 operate on a number of bits which is greater than or equal to the number of bits of the register 60. The quantizer 70 therefore brings about a reduction in the number of bits. Although not obvious from the figures, a fractional null part is added to the quantized signal $S_{quant}$ at the input of the subtraction circuit 66.

The quantized signal $S_{quant}$ is then expressed with the same number of bits of the register 60 that are dedicated to the representation of the integer part and therefore is less accurate than the accuracy permitted by the register 60. In addition to this, the sigma-delta modulator 62, and therefore also the quantizer 70, operates at a frequency equal for example to the abovementioned frequency $f_d$ (for example 20 kHz), in synchronous mode with the input signal $S_{in}$.

The quantized signal $S_{quant}$ can be expressed as a succession of samples NUM_φ[n] equal to integer numbers (optionally with sign), with NUM_φ[n]=NUM_φ$_{DC}$+NUM_φ'[n], where NUM_φ$_{DC}$ represents the mean value of NUM_φ[n], and in which NUM_φ'[n] may be considered a small noise signal with a null mean introduced by the sigma-delta modulator 62. In this respect, as mentioned above, during the calibration the user can arrange the MEMS gyroscope 50 in such a way that it has no angular velocity (or has a known angular velocity), and can vary the value NUM_φ$_{DC}$ stored in the register 60, with the accuracy permitted by the number of bits of the register 60, until the value minimizing the value of the abovementioned quantity indicating the angular velocity (or in any event the projection of component Q onto the in-phase axis, i.e., the quadrature error) is identified. In practice, during the calibration step, the value NUM_φ$_{DC}$ is varied between a plurality of test values (with an integer and fractional part) so as to generate corresponding demodulated signals $S_{dem}$ in order to identify the value for which the corresponding demodulated signal $S_{dem}$ exhibits the smallest quadrature error; this value will be used after calibration when the MEMS gyroscope 50 is exposed to an unknown angular velocity. In these conditions, NUM_φ$_{DC}$*φ$_{step}$=Δφ, within the limits of the accuracy permitted, among other things, by the number of bits of the register 60.

Figure 2:
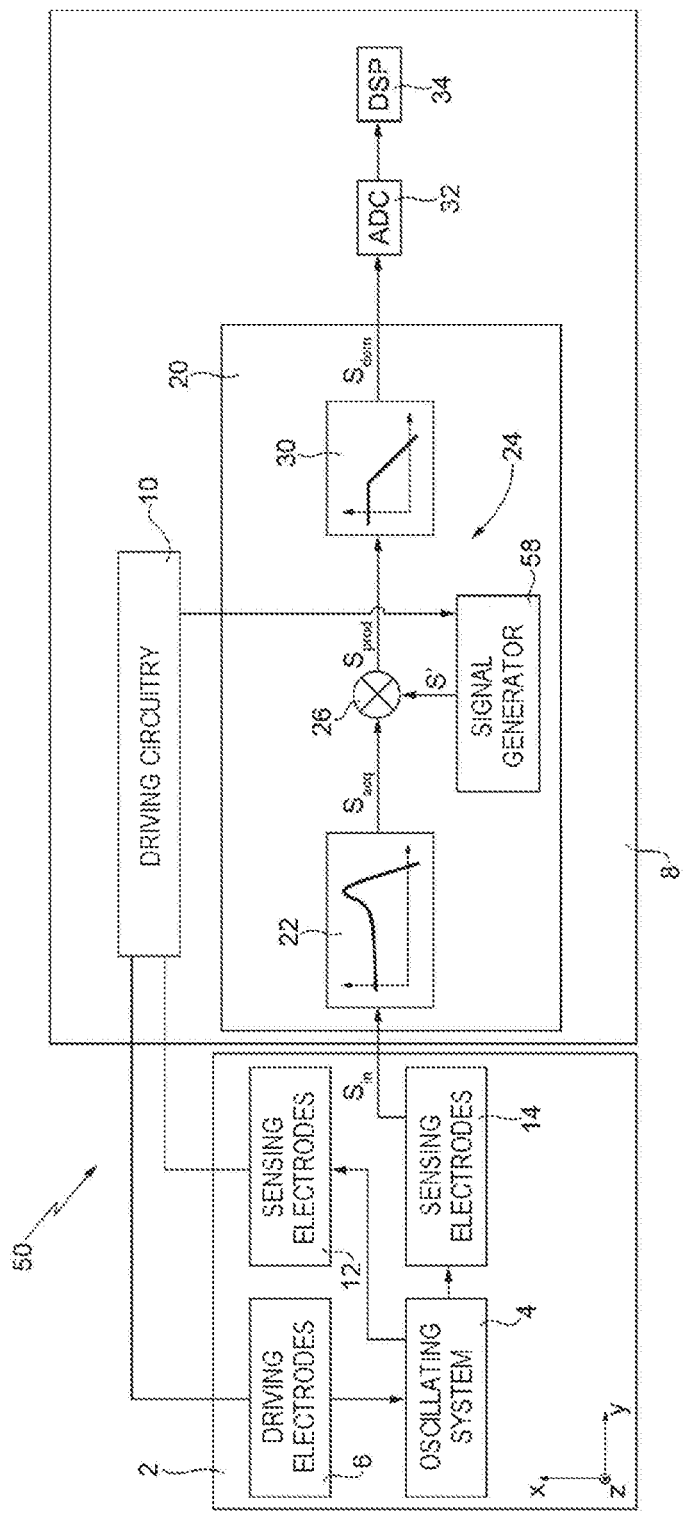
FIG. 2 is a block diagram of a MEMS gyroscope according to embodiments of the present disclosure.

This being the case, the output stage 64 receives the clock signal from the driving circuitry 10 and operates at the frequency $f_{PLL}$ (as mentioned, with $f_{PLL}$=N*$f_d$ and N for example equal to 1024), in such a way as to generate the demodulating signal S', which is then multiplied by the acquired signal $S_{acq}$ by the multiplier stage 26, in such a way as to generate the product signal $S_{prod}$ (FIG. 2).

The demodulating signal S' is of analog type and is locked in phase with the acquired signal $S_{acq}$, and therefore also with the driving signal and with the in-phase component and the quadrature component of the input signal $S_{in}$. Furthermore, the demodulating signal S' is formed for example by a square wave equal to a sign function with an argument of cos($\omega_d$t+φ$_{trim}$[n]), or by the sinusoidal signal cos($\omega_d$t+φ$_{trim}$[n]), where φ$_{trim}$[n]=φ$_{step}$*NUM_φ[n].

Figure 4:
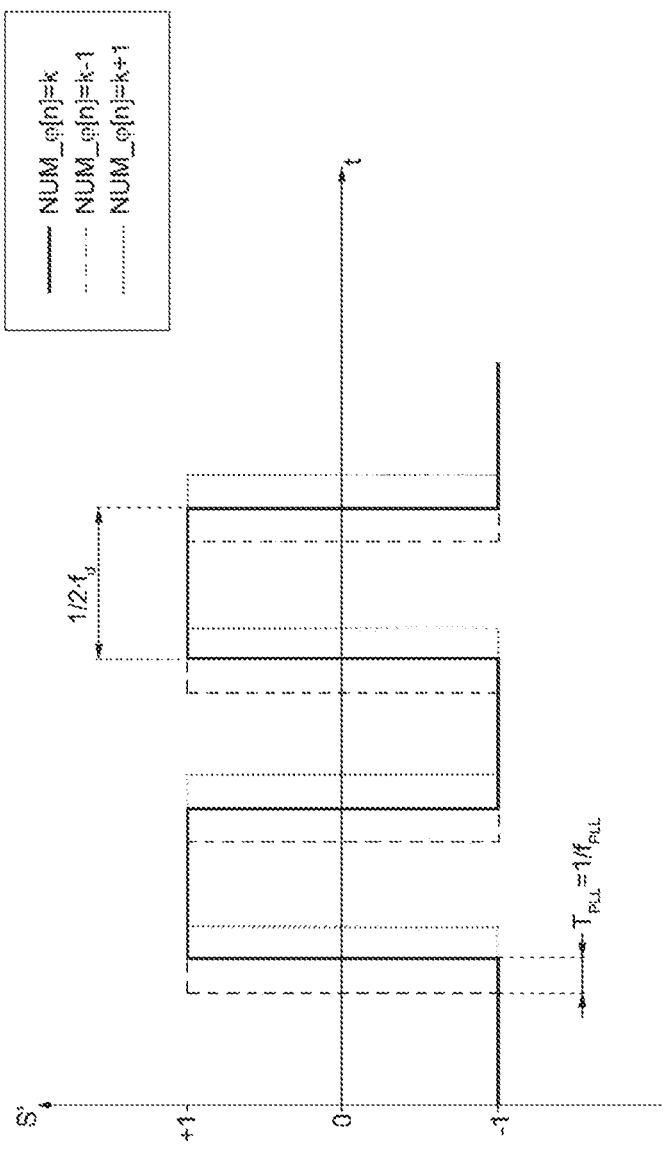
FIG. 4 shows examples of the changes over time in portions of a signal generated in the MEMS gyroscope of FIGS. 2 and 3.

It will be assumed below, without any loss of generality, that the demodulating signal S' is equal to the abovementioned square wave. An example of a portion of the demodulating signal S' is shown in FIG. 4; in particular, FIG. 4 shows the phase changes in the demodulating signal S' when the value adopted by NUM_φ[n] varies by ±1 with respect to an example value indicated by k. In this respect, the advance/delay in the leading edges of the demodulating signal S' as a function of the value adopted by NUM_φ[n] can be seen in FIG. 4; without any loss of generality, each falling edge follows the corresponding leading edge with a delay of 1/(2*$f_d$).

In practice, the output stage 64 modulates the phase of the demodulating signal S' as a function of the values of the succession NUM_φ[n]. More particularly, the phase of the demodulating signal S' depends linearly on NUM_φ[n], through a coefficient equal to φ$_{step}$.

This being the case, from a mathematical point of view, it can be demonstrated that, given the abovementioned demodulating signal S', the demodulated signal $S_{dem}$ is proportional to C*cos(Δφ−φ$_{trim}$[n])−Q*sin(Δφ−φ$_{trim}$[n]). In addition to this, by noting that φ$_{trim}$[n]=φ$_{step}$*(NUM_φ$_{DC}$+NUM_φ'[n]), with NUM_φ$_{DC}$*φ$_{step}$=Δφ and with NUM_φ'[n], which can be considered to be a small signal with a null mean, it is found that the demodulated signal $S_{dem}$ is proportional to C*cos(φ$_{step}$*NUM_φ'[n])−Q*sin($\omega_{step}$*NUM_φ'[n]); in addition to this, to a first approximation it can be assumed that cos(φ$_{step}$*NUM_φ'[n])≈1 and sin(φ$_{step}$*NUM_φ'[n])≈φ$_{step}$*NUM_φ'[n]. It can therefore be assumed that the demodulated signal $S_{dem}$ is directly proportional to C−Q*φ$_{step}$*NUM_φ'[n]. It follows that while the Coriolis component C is unchanged, the component Q is modulated by NUM_φ'[n], which has a null mean, and the projection of the quadrature signal onto the Coriolis axis is therefore substantially reduced.

Purely by way of example, the effect of the signal generator 58 can be better appreciated assuming that Δφ is equal to 40.5 mrad, that is it is equivalent to 6.6*$T_{PLL}$, where $T_{PLL}$=1/$f_{PLL}$ and $f_{PLL}$=20.48 MHz=$f_d$*$2^{10}$. In this case the user is able to identify NUM_φ$_{DC}$=6.6 through successive attempts.

The integer part and the fractional part of the value stored in the register 60 are then set to be equal to 6 and 0.6 respectively. Also the succession of the values NUM_φ[n] which forms the quantized signal $S_{quant}$ is given by a series of integer numbers which, as mentioned, are less accurate than the values stored in the register 60 and follow each other in time in such a way that the mean value of the succession is equal to 6.6 and the spectral density of the noise of the quantized signal $S_{quant}$ increases with frequency. Also, each value in the succession NUM_φ[n] is associated with a corresponding phase shift in the edges (for example the leading edges) of the square wave forming the demodulating signal S'. The step through which the positions of the edges, and therefore the phase, of the demodulating signal S' can be varied is again equal to 2π*$f_d$/$f_{PLL}$, but the effect of the quadrature component on the Coriolis axis is reduced in comparison with what happens in the known art; in particular, it can be demonstrated that the reduction is equal to $2^{bit\_frac}$, where bit_frac indicates the number of bits of the register 60 dedicated to storing the fractional part of NUM_φ$_{DC}$. In addition to this, it is found that the noise introduced by the sigma-delta modulator 62, represented by the succession of values NUM_φ'[n], has a spectrum which extends substantially to frequencies higher than the frequencies of interest, that is higher than the frequencies of the demodulated signal $S_{dem}$, which may for example have a range of between 0 Hz and 400 Hz.

From what has been described and illustrated above, the advantages which the present solution makes it possible to obtain are clearly apparent.

In particular the present demodulator makes it possible to reduce the effect of the quadrature component, equal to the frequency of the clock signal and without the need to implement complex circuitry architectures.

In conclusion it is clear that modifications and variants may be made to what has been described and illustrated hitherto, without thereby going beyond the scope of the protection of this disclosure as defined in the appended claims.

For example, the sigma-delta modulator 62 may be of a different type from that described. More generally, the sigma-delta modulator 62 may be replaced by any noise-shaping modulator which generates integer quantized samples in a per se known manner, introducing quantizing noise at frequencies higher than the frequency of interest, that is higher than the frequency of the demodulated signal $S_{dem}$.

It is also possible that the driving circuitry 10 and the processing stage 20 are formed on different dies.

According to a different embodiment (not shown), the sigma-delta modulator 62, and therefore also the quantizer 70, operates at a frequency of 2*$f_d$; thus the output stage 64 receives two samples of the quantized signal $S_{quant}$ for every period equal to $1/f_d$. The demodulating signal S' may again be formed by a square wave equal to a sign function with an argument of $\cos(\omega_d t + \varphi_{trim}[n])$, or a sinusoidal signal $\cos(\omega_d t + \varphi_{trim}[n])$, where $\varphi_{trim}[n] = \varphi_{step} * \text{NUM}\_\varphi[n]$, but the values of $\varphi_{trim}[n]$ vary at a frequency of $2*f_d$. In this way, referring for example to the case where the demodulating signal S' is formed by a square wave, all the phase shifts introduced at a leading edge and a falling edge which are consecutive to each other depend respectively on two different (consecutive) samples of $\varphi_{trim}[n]$; the time distance between two such edges may then be different from $1/(2*f_d)$. An embodiment of this form makes it possible to distribute the noise over a band double in comparison with what has been described previously, with a consequent further reduction in the noise at the frequencies of interest.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A demodulator, comprising:
    a register configured to store a phase calibration value having an integer part and a fractional part;
    a noise-shaping modulator configured to generate a succession of quantized values of integer type, the quantized values having a mean equal to the phase calibration value;
    a generation stage configured to generate a demodulating signal phase locked with an input signal modulated in-phase and quadrature, the demodulating signal having a phase which depends linearly on the quantized values; and
    a demodulation stage configured to demodulate the input signal through the demodulating signal.

2. The demodulator according to claim 1 wherein the noise-shaping modulator comprises a sigma-delta modulator.

3. The demodulator according to claim 2, wherein the input signal has a first frequency and wherein the generation stage is configured to receive a clock signal phase locked with the input signal and having a second frequency equal to an integer multiple of the first frequency, and wherein the phase of the demodulating signal depends on the quantized values through a coefficient which is directly proportional to the ratio between the first and second frequencies.

4. The demodulator according to claim 3 wherein the noise-shaping modulator is configured to generate the succession of quantized values with a frequency equal to the first frequency or twice the first frequency.

5. The demodulator of claim 1, wherein the demodulating signal is a square wave signal.

6. The demodulator of claim 1, wherein the demodulator stage comprises:
    a multiplier circuit configured to multiply the input signal and the demodulating signal to generate a product signal; and
    a filter coupled to the multiplier circuit to receive the product signal and configured to filter the product signal to generate the and includes receive the input signal and having an output coupled to a high pass filter configured to generate a demodulated signal.

7. A control and sensing circuit for a MEMS gyroscope, comprising:
    a demodulator including,
        a register configured to store a phase calibration value having an integer part and a fractional part;
        a noise-shaping modulator configured to generate a succession of quantized values of integer type, the quantized values having a mean equal to the phase calibration value;
        a generation circuit configured to generate a demodulating signal phase locked with an input signal modulated in-phase and quadrature, the demodulating signal having a phase which depends linearly on the quantized values; and
        a demodulation circuit configured to demodulate the input signal through the demodulating signal; and
    a driving circuit configured to be coupled to an oscillating system that generates the input signal, the driving circuit configured to generate a clock signal and to provide the oscillating system with a driving signal having a first frequency.

8. The control and sense circuit according to claim 7, wherein the demodulator and the driving circuit are formed in a main die.

9. The control and sense circuit according to claim 8, wherein the input signal is received from the oscillating system that is formed in a second die separate from the main die.

10. The control and sense circuit according to claim 7, wherein the noise-shaping modulator is a sigma-delta modulator.

11. The demodulator according to claim 7, wherein the driving circuit includes a phase-locked loop configured to generate a clock signal that is phase locked with the input signal and having a second frequency equal to an integer multiple of the first frequency, the clock signal being applied to the generation circuit.

12. The demodulator according to claim 11, wherein the phase of the demodulating signal depends on the quantized values through a coefficient which is directly proportional to a ratio of the first and second frequencies.

13. The demodulator according to claim 12, wherein the noise-shaping modulator is configured to generate the succession of quantized values with a frequency equal to the first frequency or twice the first frequency.

14. A MEMS gyroscope, comprising:
    a control and sense circuit including:
        a demodulator including,
            a register configured to store a phase calibration value having an integer part and a fractional part;
            a noise-shaping modulator configured to generate a succession of quantized values of integer type, the quantized values having a mean equal to the phase calibration value;
            a generation circuit configured to generate a demodulating signal phase locked with an input signal modulated in-phase and quadrature, the demodulating signal having a phase which depends linearly on the quantized values; and
            a demodulation circuit configured to demodulate the input signal through the demodulating signal; and
        a driving circuit configured to receive the input signal, the driving circuit configured to generate a clock signal and to provide the oscillating system with a driving signal having a first frequency; and oscillating system coupled to the driving circuit and configured to generate the input signal, the input signal being indicative of an angular velocity experienced by the MEMS gyroscope.

15. The MEMS gyroscope according to claim 14, wherein said the demodulator and driving circuit are formed in a first die and the oscillating system is formed in a secondary die.

16. A method for demodulating an in-phase component of an input signal that is in-phase and quadrature modulated, the method comprising:
   storing a phase calibration value having an integer part and a fractional part;
   generating a succession of quantized values of integer type, the quantized values having a mean equal to the phase calibration value;
   generating a demodulating signal phase locked with the input signal, the demodulating signal having a phase which depends linearly on the quantized values; and
   demodulating the input signal by means of the demodulating signal.

17. The demodulation method according to claim 16 wherein the input signal has a first frequency, wherein the method further comprises:
   generating a clock signal phase locked with the input signal and having a second frequency that is equal to an integer multiple of the first frequency; and
   wherein generating the demodulating signal includes generating the demodulating signal on the basis of the clock signal with the phase being a function of the quantized values through a coefficient that is directly proportional to a ratio between the first and second frequencies.

18. The method of claim 16, wherein generating the succession of quantized values comprises generating the succession of quantized through noise-shaping modulation.

19. The method of claim 18, wherein generating the succession of quantized values through noise-shaping modulation comprises generating the succession of quantized values through sigma-delta modulation.

20. A method, comprising:
   performing a calibration of a MEMS gyroscope that includes arranging the MEMS gyroscope in a way in which it experiences a known or zero angular velocity;
   for each value of a plurality of test values, each test value having an integer part and a fractional part, the method including:
   storing the test value;
   generating through a noise-shaping modulator a succession of quantized values of the integer type, quantized values having a mean equal to the test value;
   generating a corresponding demodulating signal phase locked with a sense signal generated by the MEMS gyroscope when experiencing the known or zero angular velocity, the demodulating signal having a phase which depends linearly on the quantized values; and
   through the corresponding demodulating signal, demodulating a sense signal generated by the MEMS gyroscope to generate a corresponding base band signal;
   selecting the test value that provides the corresponding base band signal having the smallest quadrature error; and
   storing the selected test value.

* * * * *